(12) United States Patent
Schauer et al.

(10) Patent No.: US 9,991,208 B2
(45) Date of Patent: Jun. 5, 2018

(54) SUSCEPTOR FOR HOLDING A SEMICONDUCTOR WAFER HAVING AN ORIENTATION NOTCH, A METHOD FOR DEPOSITING A LAYER ON A SEMICONDUCTOR WAFER, AND SEMICONDUCTOR WAFER

(71) Applicant: SILTRONIC AG, Munich (DE)

(72) Inventors: Reinhard Schauer, Laufen (DE); Christian Hager, Kastl (DE)

(73) Assignee: SILTRONIC AG, Munich (DE)

( * ) Notice: Subject to any disclaimer, the term of this patent is extended or adjusted under 35 U.S.C. 154(b) by 0 days. days.

(21) Appl. No.: 15/260,629

(22) Filed: Sep. 9, 2016

(65) Prior Publication Data

US 2017/0117228 A1    Apr. 27, 2017

(30) Foreign Application Priority Data

Oct. 27, 2015    (DE) .......................... 10 2015 220 924

(51) Int. Cl.
*C23C 16/00* (2006.01)
*H01L 23/544* (2006.01)
(Continued)

(52) U.S. Cl.
CPC ............ *H01L 23/544* (2013.01); *C23C 16/24* (2013.01); *C23C 16/4585* (2013.01);
(Continued)

(58) Field of Classification Search
CPC ............. H01L 23/544; H01L 21/68785; H01L 21/68735; H01L 29/16; H01L 21/02381;
(Continued)

(56) References Cited

U.S. PATENT DOCUMENTS

| 6,368,450 B2 | 4/2002 | Hayashi |
| 2007/0062438 A1* | 3/2007 | Schauer ................. C30B 29/06 117/89 |

(Continued)

FOREIGN PATENT DOCUMENTS

| JP | 05029230 A | 2/1993 |
| JP | 2010-034372 A | 2/2010 |
| JP | 2013-051290 A | 3/2013 |

*Primary Examiner* — Jarrett Stark
(74) *Attorney, Agent, or Firm* — Brooks Kushman P.C.

(57) ABSTRACT

A semiconductor wafer processing susceptor for holding a wafer having an orientation notch during deposition of a layer on the wafer, having a placement surface for supporting the semiconductor wafer in the rear edge region of the wafer, the placement surface having a stepped outer delimitation, and an indentation of the outer delimitation of the placement surface for placement of the partial region of the edge region of the rear side of the wafer in which the orientation notch is located onto a partial region of the placement surface delimited by the indentation of the outer delimitation of the placement surface. The susceptor is used in a method for depositing a layer on a wafer having an orientation notch, and wafers made of monocrystalline silicon upon which layers are deposited using the susceptor have greater local flatness on both front and rear sides proximate the orientation notch.

4 Claims, 4 Drawing Sheets

(51) Int. Cl.
- H01L 21/02 (2006.01)
- H01L 21/68 (2006.01)
- H01L 21/687 (2006.01)
- H01L 29/16 (2006.01)
- C23C 16/24 (2006.01)
- C30B 25/12 (2006.01)
- C23C 16/458 (2006.01)
- C30B 25/20 (2006.01)
- C30B 29/06 (2006.01)

(52) U.S. Cl.
CPC .............. *C30B 25/12* (2013.01); *C30B 25/20* (2013.01); *C30B 29/06* (2013.01); *H01L 21/02381* (2013.01); *H01L 21/02428* (2013.01); *H01L 21/02532* (2013.01); *H01L 21/02634* (2013.01); *H01L 21/68* (2013.01); *H01L 21/68735* (2013.01); *H01L 21/68785* (2013.01); *H01L 29/16* (2013.01); *H01L 2223/54426* (2013.01); *H01L 2223/54493* (2013.01)

(58) Field of Classification Search
CPC .............. H01L 21/68; H01L 21/02428; H01L 21/02532; H01L 21/02634; C30B 29/06; C30B 25/20; C30B 25/12; C23C 16/24; C23C 16/4585

See application file for complete search history.

(56) References Cited

U.S. PATENT DOCUMENTS

| | | | |
|---|---|---|---|
| 2007/0066036 A1* | 3/2007 | Schauer | C30B 25/02 438/478 |
| 2009/0057840 A1* | 3/2009 | Netsu | H01L 21/02024 257/618 |
| 2011/0144943 A1* | 6/2011 | Veeraraghavan | H01L 22/12 702/167 |
| 2012/0248578 A1* | 10/2012 | Masuda | H01L 21/02002 257/618 |
| 2012/0270407 A1 | 10/2012 | Werner et al. | |
| 2013/0263779 A1* | 10/2013 | Pitney | C23C 16/4585 118/500 |
| 2014/0008768 A1* | 1/2014 | Sato | H01L 21/02024 257/620 |
| 2014/0141613 A1* | 5/2014 | Heilmaier | H01L 21/02024 438/693 |
| 2014/0264765 A1* | 9/2014 | Masuda | H01L 29/30 257/618 |
| 2015/0147942 A1* | 5/2015 | Sato | B24B 37/08 451/41 |
| 2015/0162181 A1* | 6/2015 | Yamashita | B24B 37/08 438/691 |
| 2016/0189973 A1* | 6/2016 | Tabata | C09G 1/02 438/692 |

* cited by examiner

SUSCEPTOR FOR HOLDING A SEMICONDUCTOR WAFER HAVING AN ORIENTATION NOTCH, A METHOD FOR DEPOSITING A LAYER ON A SEMICONDUCTOR WAFER, AND SEMICONDUCTOR WAFER

CROSS-REFERENCE TO RELATED APPLICATIONS

This application claims priority to German Patent Application No. 102015220924.5 filed Oct. 27, 2015 which is herein incorporated by reference.

BACKGROUND OF THE INVENTION

1. Field of the Invention

The subject matter of the invention is a susceptor for holding a semiconductor wafer having orientation notch during the deposition of a layer on a front side of the semiconductor wafer. The susceptor has a placement surface for placing the semiconductor wafer in the edge region of a rear side of the semiconductor wafer and a stepped outer delimitation of the placement surface. The subject matter of the invention is also a method for depositing a layer on a semiconductor wafer having orientation notch, in which such a susceptor is used, and a semiconductor wafer made of monocrystalline silicon.

2. Description of the Related Art

Susceptors of the type mentioned are known in various embodiments. An embodiment is described in DE 198 47 101 C1, in which the placement surface is a component of a ring, which forms the susceptor. In the embodiment according to EP 1 460 679 A1, the susceptor additionally has a bottom in the form of a plate. The placement surface is formed by a projection on the plate edge. An embodiment is shown in DE 10 2006 055 038 A1, in which the semiconductor wafer lies in a depression of a ring, and the ring lies on a base plate.

When depositing a layer on the front side of a semiconductor wafer, efforts are made, inter alia, to create a layer having uniform layer thickness and to have the usable surface of the layer extend as close as possible to the edge of the semiconductor wafer. When attempting to implement this specification, one is confronted with the problem that flatness problems occur in the region of an orientation notch of the semiconductor wafer, the causes of which are a greater layer thickness and material deposits on the rear side of the semiconductor wafer. To remedy this problem, it is proposed in US 2012/0270407 A1 and JP 2013-51290 that the placement surface of the susceptor be enlarged inward at one point and the semiconductor wafer be laid on the susceptor such that the orientation notch comes to rest on the placement surface at this point.

US 2013/0264690 A1 relates to the improvement of the flatness of a semiconductor wafer having an epitaxial layer, in particular in the edge region of the semiconductor wafer. The local geometry in the edge region of the front side, expressed by $ESFQR_{mean}$ and in consideration of an edge exclusion of 1 mm, is not greater than 100 nm.

Notwithstanding the cited prior art, the demand still exists for improving the local flatness of a coated semiconductor wafer in the region of the orientation notch.

SUMMARY OF THE INVENTION

It is the object of the present invention to propose a solution which strongly reduces an excess of the layer thickness in the region of the orientation notch and material depositions on the rear side of the semiconductor wafer in the region of the orientation notch. These and other objects are achieved by a susceptor for holding a semiconductor wafer having orientation notch during the deposition of a layer on a front side of the semiconductor wafer;

a placement surface for placing the semiconductor wafer in the edge region of a rear side of the semiconductor wafer;

a stepped outer delimitation of the placement surface; and an indentation of the outer delimitation of the placement surface for placement of the partial region of the edge region of the rear side of the semiconductor wafer in which the orientation notch is located, on the partial region of the placement surface which is delimited by the indentation of the outer delimitation of the placement surface.

DETAILED DESCRIPTION OF THE PREFERRED EMBODIMENT(S)

Figure 1:
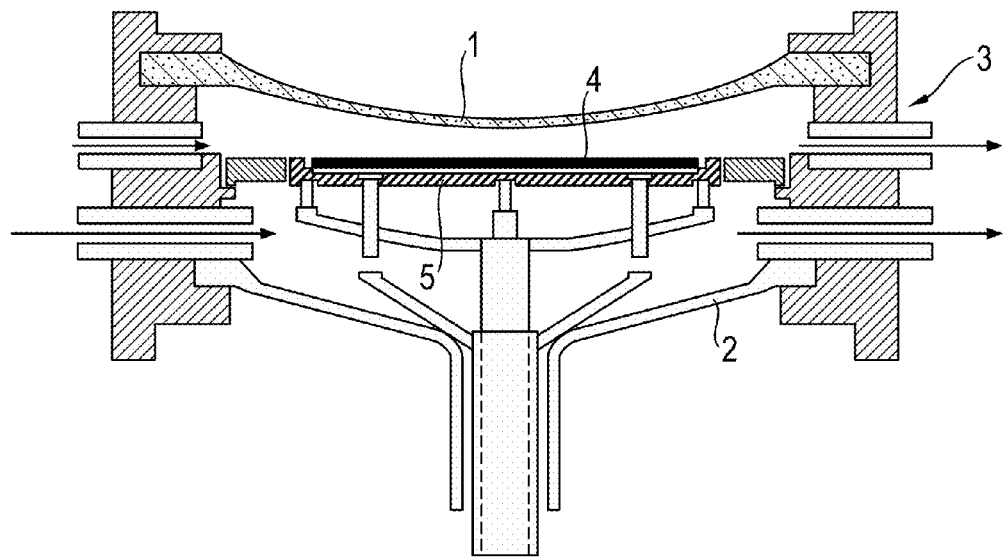
FIG. 1 shows typical features of a reactor, which is used in a method for depositing a layer on a semiconductor wafer.

The indentation of the outer delimitation of the placement surface is oriented inward and preferably has a shape which is complementary to the shape of the orientation notch of the semiconductor wafer, which is placed on the susceptor. The presence of the indentation of the outer delimitation of the placement surface has the effect that a uniform distance is ensured between an outer edge of the semiconductor wafer and the outer delimitation of the placement surface. This distance is essentially identical in the region of the orientation notch and in the region outside the orientation notch. This has an effect on the flow behavior of a deposition gas. The flow picture is also essentially identical in the region of the orientation notch and in the region outside the orientation notch. The material deposition is accordingly substantially uniform in the edge region of the semiconductor wafer.

The placement surface and the stepped outer delimitation of the placement surface form a nearly circular pocket having nearly uniform diameter for accommodating a semiconductor wafer having an orientation notch. Because of the indentation of the outer delimitation of the placement surface, the diameter of the outer delimitation of the placement surface is smaller at this point than at the remaining points.

The radial width of the placement surface is the distance between the outer delimitation of the placement surface and an inner edge of the placement surface. The radial width of the placement surface is much less than the diameter which the outer delimitation of the placement surface has outside the indentation. It is preferably not greater than 10% of this diameter. The placement surface is sufficiently wide, on the other hand, to underlay a semiconductor wafer placed thereon completely in the region of the orientation notch thereof, i.e., in the region of the indentation of the outer delimitation of the placement surface, the placement surface has a radial width, as a result of which the placement surface extends at least as far inward as an orientation notch of a semiconductor wafer lying on the placement surface in this region. The access of deposition gas through the orientation notch to the rear side of the semiconductor wafer is thus made more difficult.

The radial width of the placement surface is preferably uniform, i.e., essentially the same in the region of the indentation of the outer delimitation of the placement surface as outside this region. In this case, an inwardly oriented indentation of the placement surface is provided in the region of the placement surface which is delimited by the indentation of the outer delimitation of the placement surface.

Notwithstanding this, it is also possibly provided that the placement surface has a smaller radial width in the region of the indentation of the outer delimitation of the placement surface than outside this region.

The placement surface is arranged horizontally or inclined sloping inward somewhat. The angle of inclination is preferably not greater than 3°. The profile of the inclination can be linear or curved.

The susceptor can be formed as a ring, comprising the placement surface and the outer delimitation of the placement surface. Furthermore, the susceptor can be formed as a plate, additionally comprising a disk-shaped plate bottom, which lies adjacent to the inner edge of the placement surface and lower than the placement surface. In addition, the susceptor can also be formed in two parts, one part as a ring, comprising the placement surface and the outer delimitation of the placement surface, the other part as a separate base plate, which carries the ring. The plate bottom or the base plate can be gas-impermeable. However, it can also be formed perforated, to ensure a gas transport through holes. A plate bottom or a base plate preferably has micropores instead of holes for such a gas transport. The micropores can be created, for example, in that fibers and/or particles are compacted into the shape of the plate bottom or the base plate.

The susceptor preferably consists of silicon carbide or a material, for example, graphite, which is coated using silicon carbide.

The subject matter of the invention is also a method for depositing a layer on a semiconductor wafer having orientation notch, characterized by the placement of the semiconductor wafer on a susceptor according to the invention, wherein the region of the edge region of the rear side of the semiconductor wafer, in which the orientation notch is located, is placed on the region of the placement surface of the susceptor which is delimited by the indentation of the outer delimitation of the placement surface, and by the supply of a process gas to the front side of the semiconductor wafer and the deposition of the layer on the front side of the semiconductor wafer.

The method results in improved flatness of the semiconductor wafer having a deposited layer in the region of the orientation notch and more uniform flatness in the edge region of the semiconductor wafer having the deposited layer.

After the placement of the semiconductor wafer on the susceptor, the edge of the semiconductor wafer, also in the region of the orientation notch, essentially has an identical distance to the outer delimitation of the placement surface. If the indentation of the outer delimitation of the placement surface were absent, this distance would be greater in the region of the orientation notch than outside this region. Because of the greater distance, more material would be deposited in the region of the orientation notch than outside this region, because as a result of the greater distance, a larger quantity of deposition gas reaches the edge region of the front side of the semiconductor wafer. Depositions in the edge region of the rear side of the semiconductor wafer behave similarly. Greater distances of the edge of the semiconductor wafer to the outer delimitation of the placement surface result in stronger coating of the rear side of the semiconductor wafer in the region of the orientation notch. This effect is particularly pronounced if the placement surface is inclined sloping inward and/or the susceptor consists of a porous material, which is permeable to the deposition gas, and/or the plate bottom or the base plate is provided with regularly arranged holes, which make the access of deposition gas to the rear side of the semiconductor wafer easier.

The method is preferably used for depositing an epitaxial layer on a monocrystalline semiconductor wafer, particularly preferably for depositing an epitaxial layer made of silicon on a semiconductor wafer made of monocrystalline silicon. The semiconductor wafer made of monocrystalline silicon preferably has a diameter of not less than 200 mm, particularly preferably a diameter of not less than 300 mm. The thickness of the epitaxial layer is preferably not less than 1.5 μm and not greater than 5 μm.

The subject matter of the invention is also the product of such a method, namely a semiconductor wafer made of monocrystalline silicon having a diameter, a front side, a rear side, an edge region, an orientation notch in the edge region, and an epitaxial layer made of silicon on the front side, wherein the epitaxial layer has a thickness of not less than 1.5 μm and not greater than 5 μm, characterized by a local flatness of the semiconductor wafer in the region of the orientation notch, expressed by ESFQR, of not less than 5 nm and not greater than 20 nm.

ESFQR is a parameter which describes the local flatness of 72 sectors in the edge region of the front side of the semiconductor wafer. A sector has a width of 5° and a radial length of 30 mm. According to the invention, the sector in which the orientation notch is located has a local flatness ESFQR of not less than 5 nm and not greater than 20 nm, wherein an edge exclusion (EE) of 1 mm and a rectangular exclusion window around the orientation notch (notch exclusion window) remain unconsidered in the determination of the ESFQR. The rectangular exclusion window is centrally above the orientation notch and has a width of 4 mm and a height of 2.5 mm. The height extends from the circumference of the semiconductor wafer along the middle of the orientation notch.

The thickness of material deposition on the rear side of the semiconductor wafer, on a rectangular evaluation area enclosing the orientation notch, is preferably not greater than 15 nm. The evaluation area is located centrally above the orientation notch and has a width of 8 mm and a height of 3.5 mm. The height extends along the center of the orientation notch and has a distance from 0.5 mm to the circumference of the semiconductor wafer. The circumference of a circle having the center of the semiconductor wafer as the center of the circle and having the diameter of the semiconductor wafer is the circumference of the semiconductor wafer. The center of the orientation notch extends from the apex of the orientation notch radially up to the circumference of the semiconductor wafer. The apex of the orientation notch is located at the location of the orientation notch having the smallest distance to the center of the semiconductor wafer.

The invention will be described in greater detail hereafter on the basis of drawings and an example.

The reactor according to FIG. 1 comprises a chamber having an upper dome 1, a lower dome 2, and a side wall 3. The upper and lower domes 1, 2 are transparent to thermal radiation, which is emitted from a radiant heater arranged above and below the chamber. The layer is deposited from the gas phase on the front side of the semiconductor wafer 4, in that deposition gas is conducted over the front side of the heated semiconductor wafer and reacts at this time with the surface of the exposed front side while forming the layer. The lateral surface of the semiconductor wafer, on which one intends to deposit the layer, is referred to as the front side. This is typically a polished lateral surface of the semiconductor wafer in this case. Due to the deposition of the layer, the semiconductor wafer receives a new front side, which is formed by the free surface of the layer. The deposition gas is supplied through a gas inlet in the side wall of the chamber and the exhaust gas remaining after the reaction is discharged through a gas outlet in the side wall of the chamber. Embodiments of the chamber are known which have a further gas inlet and a further gas outlet. Such embodiments are used, for example, to introduce and discharge flushing gas into and out of the volume of the chamber present below the semiconductor wafer.

During the deposition of a layer, the semiconductor wafer is held by a susceptor 5 and rotated together with the susceptor about its center.

Figure 2:
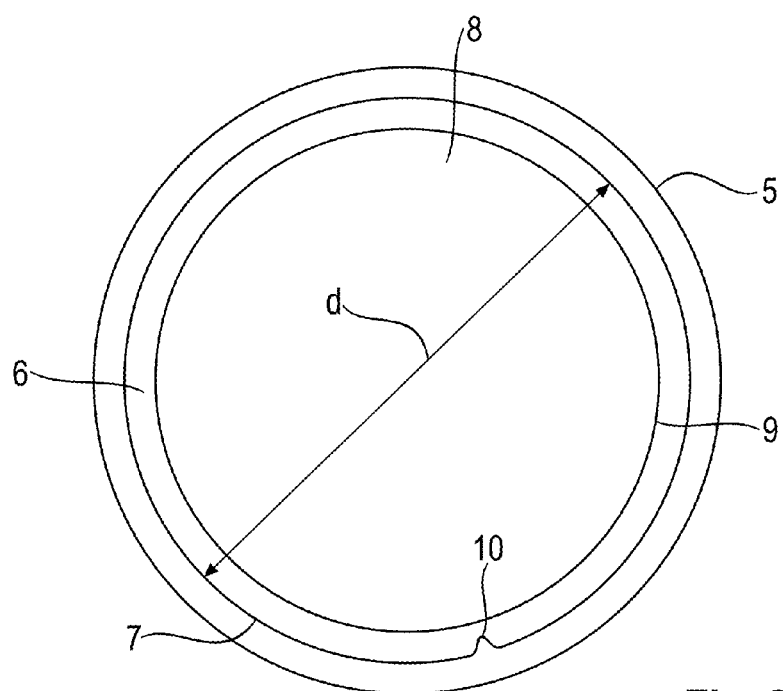
FIG. 2 shows a susceptor designed according to the invention in a top view.

FIG. 2 shows a susceptor according to the invention in a top view. The susceptor 5 comprises a placement surface 6 for the placement of a semiconductor wafer in the edge region of a rear side of the semiconductor wafer and a stepped outer delimitation 7 of the placement surface. The placement surface extends from the stepped outer delimitation 7 up to an inner edge 9 of the placement surface. The susceptor 5 has the shape of a plate having a bottom 8. The bottom 8 is arranged lower than the placement surface 6. The stepped outer delimitation 7 has an inwardly oriented indentation 10. The indentation 10 is approximately V-shaped and therefore shaped complementary to the shape of the orientation notch of a semiconductor wafer. The diameter d of the outer delimitation 7 of the placement surface outside the region of the indentation 10 is greater than the diameter of a semiconductor wafer to be placed.

Figure 3:
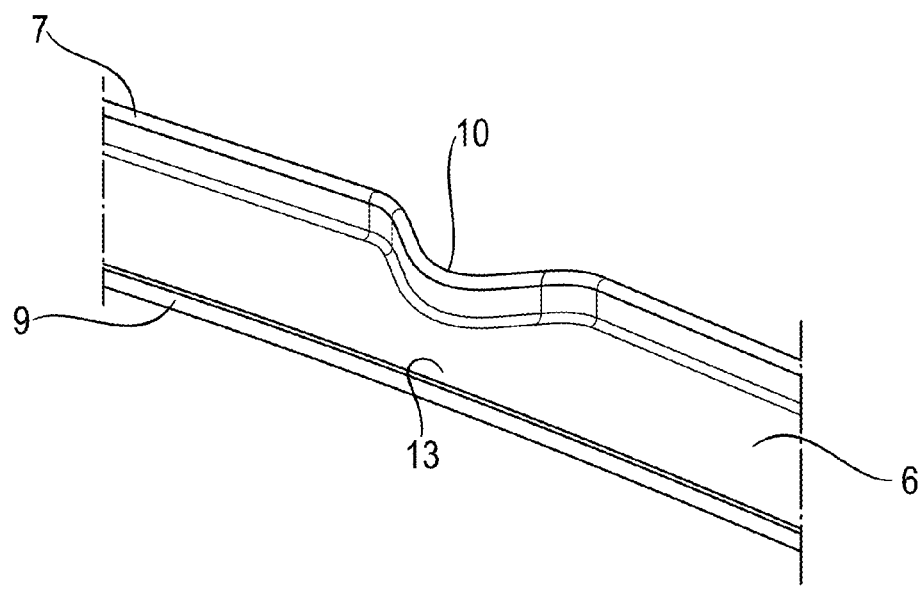
FIG. 3 shows an enlarged illustration of the region of the placement surface of the susceptor according to FIG. 2, which is delimited by the indentation of the outer delimitation of the placement surface.

It can be seen in the enlarged illustration according to FIG. 3 that the placement surface of the illustrated embodiment is less wide in the region of the indentation 10 than outside this region.

Figure 4:
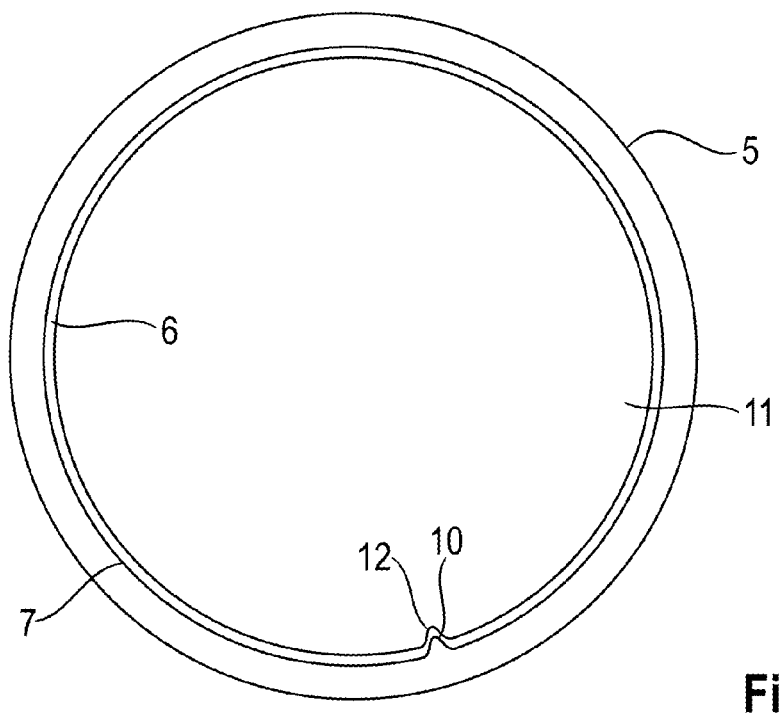
FIG. 4 shows the susceptor according to FIG. 2 and additionally a semiconductor wafer having orientation notch, which is placed on the susceptor.

FIG. 4 shows the susceptor 5 according to FIG. 2 having a semiconductor wafer 11 placed thereon having orientation notch 12. The semiconductor wafer 11 is located in the edge region of the rear side thereof on the placement surface 6, in such a way that the region of the edge region of the rear side of the semiconductor wafer in which the orientation notch 12 is located is placed on the region of the placement surface 6 which is delimited by the indentation 10 of the outer delimitation.

Figure 5:
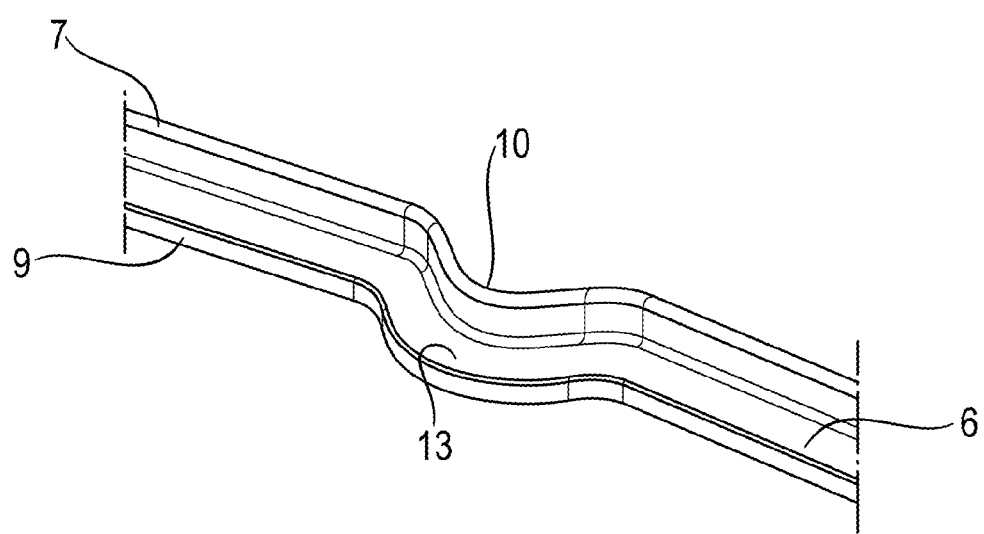
FIG. 5 shows an enlarged illustration of the region of the placement surface of a susceptor which is delimited by the indentation of the outer delimitation of the placement surface, and additionally an indentation of the placement surface in this region.

FIG. 5 shows an enlarged illustration of the region of the indentation 10 of the outer delimitation of the placement surface of a susceptor, the embodiment of which is particularly preferred. The placement surface 6 is the same width in the region of the indentation 10 as outside this region. As a result of this, an inwardly oriented indentation 13 of the placement surface 6 is also provided in this region

EXAMPLE AND COMPARATIVE EXAMPLE

Semiconductor wafers made of monocrystalline silicon having a diameter of 300 mm were coated in a reactor according to FIG. 1 with a 2.5 µm thick epitaxial layer made of silicon. Subsequently, the local flatness ESFQR of the sector having the orientation notch was determined by means of a measuring device of the type WaferSight of the producer KLA-Tencor Corporation and the topography of the rear side in the region of the orientation notch was studied by means of a confocal microscope.

During the deposition of the epitaxial layer, the semiconductor wafers according to the example were laid in the edge region of the rear side thereof on a susceptor according to the invention having the features shown in FIG. 5 in the region of the indentation of the outer delimitation of the placement surface. The indentation of the outer delimitation and the orientation notch of the semiconductor wafer were arranged in relation to one another as shown in FIG. 4.

In contrast, semiconductor wafers according to the comparative example were laid during the deposition of the epitaxial layer on a susceptor having the features described in US 2012/0270407 A1. The orientation notch was underlaid by the projection of the placement surface shown therein The ESFQR in the sector having the orientation notch was not greater than 20 nm, at best not greater than 10 nm, with an edge exclusion of 1 mm, in the semiconductor wafers according to the example.

In contrast, in the semiconductor wafers according to the comparative example, the ESFQR in the sector having the orientation notch was not less than 40 nm.

Figure 6:
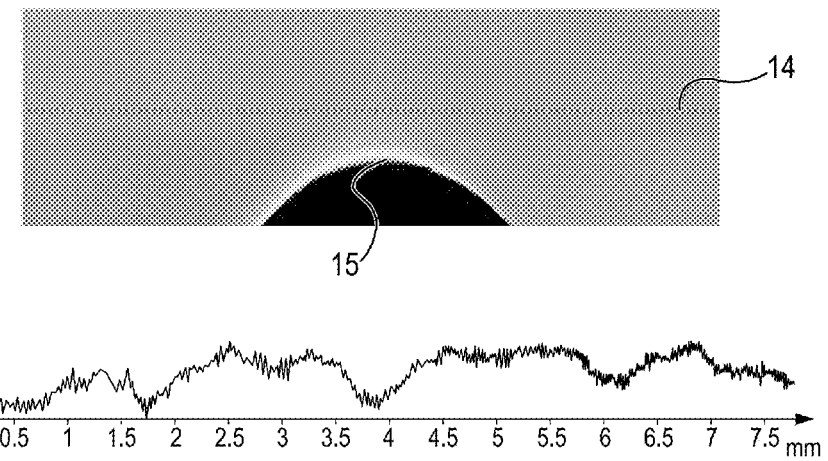
FIG. 6 shows a material deposition on the rear side of a semiconductor wafer produced according to the invention in the region of the orientation notch and the height profile of the material deposition along a line having a small distance to the apex of the orientation notch.
Figure 7:
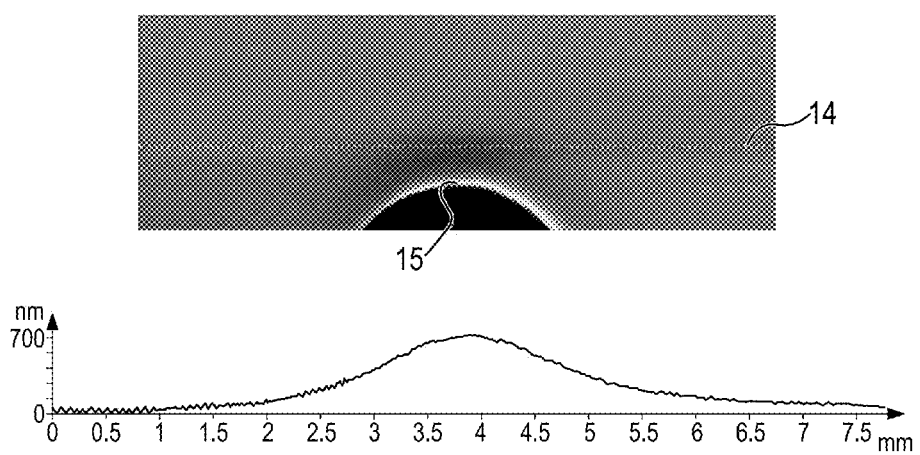
FIG. 7 shows an illustration corresponding to FIG. 6 of a semiconductor wafer, which was not produced according to the invention.

FIG. 6 and FIG. 7 show the topography and the height profile of material depositions on the rear side in the region of the orientation notch of a semiconductor wafer having epitaxial coating according to the example (FIG. 6) and comparative example (FIG. 7). Note the different scales of the vertical axes.

Optical evaluation using a confocal microscope shows, in the case of the semiconductor wafer according to the example, almost no shadow in the region of the orientation notch (FIG. 6), while in contrast, in the case of the semiconductor wafer according to the comparative example, a shadow which indicates a material deposition in this region is clearly recognizable (FIG. 7).

In both cases, the associated height profile of the material deposition was determined along a line 14, which had a distance of 1 mm to the apex 15 of the orientation notch of the respective semiconductor wafer. The line was selected because the evaluation in the confocal microscope caused it to be expected that the material deposition will have the greatest thickness within the evaluation area there.

The greatest thickness of the material deposition was hardly greater than 10 nm in the case of the semiconductor wafer according to the example (FIG. 6), but was greater than 700 nm in the case of the semiconductor wafer according to the Comparative Example (FIG. 7).

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A semiconductor wafer comprising monocrystalline silicon having a diameter, a front side, a rear side, an edge region, an orientation notch in the edge region, and a deposited epitaxial layer comprising silicon on the front side, wherein the epitaxial layer has a thickness of not less than 1.5 µm and not greater than 5 µm, the semiconductor wafer having a local flatness in a region of the orientation notch, expressed by ESFQR, of not less than 5 nm and not greater than 20 nm.

2. The semiconductor wafer of claim 1, which has a diameter of not less than 200 mm.

3. The semiconductor wafer of claim 1, with a material deposition on the rear side of the semiconductor wafer on a rectangular evaluation area enclosing the orientation notch, wherein the thickness of the material deposition is not greater than 15 nm.

4. The semiconductor wafer of claim 2, with a material deposition on the rear side of the semiconductor wafer on a rectangular evaluation area enclosing the orientation notch, wherein the thickness of the material deposition is not greater than 15 nm.

* * * * *